United States Patent
Bando et al.

(10) Patent No.: US 10,873,008 B2
(45) Date of Patent: Dec. 22, 2020

(54) LIGHT EMITTING DEVICE AND METHOD OF MANUFACTURING SAME

(71) Applicant: NICHIA CORPORATION, Anan (JP)

(72) Inventors: Shusaku Bando, Anan (JP); Takanobu Sogai, Anan (JP); Satoshi Shichijo, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 15/934,551

(22) Filed: Mar. 23, 2018

(65) Prior Publication Data

US 2018/0277721 A1    Sep. 27, 2018

(30) Foreign Application Priority Data

Mar. 24, 2017  (JP) ................................ 2017-059435

(51) Int. Cl.
| | |
|---|---|
| *H01L 33/50* | (2010.01) |
| *H01L 33/54* | (2010.01) |
| *H01L 33/38* | (2010.01) |
| *H01L 33/60* | (2010.01) |
| *H01L 25/075* | (2006.01) |
| *H01L 33/48* | (2010.01) |
| *H01L 33/56* | (2010.01) |
| *H01L 33/58* | (2010.01) |

(52) U.S. Cl.
CPC .......... *H01L 33/502* (2013.01); *H01L 33/382* (2013.01); *H01L 33/387* (2013.01); *H01L 33/505* (2013.01); *H01L 33/507* (2013.01); *H01L 33/54* (2013.01); *H01L 33/60* (2013.01); *H01L 25/0753* (2013.01); *H01L 33/486* (2013.01); *H01L 33/56* (2013.01); *H01L 2933/005* (2013.01)

(58) Field of Classification Search
CPC ....... H01L 33/60; H01L 33/507; H01L 33/56; H01L 33/50; H01L 33/502; H01L 33/504; H01L 33/501; H01L 33/505; H01L 33/54; H01L 33/486; H01L 2933/0058
See application file for complete search history.

(56) References Cited

U.S. PATENT DOCUMENTS

| 2010/0264438 A1 | 10/2010 | Suenaga |
|---|---|---|
| 2013/0026527 A1 | 1/2013 | Ichikawa |

(Continued)

FOREIGN PATENT DOCUMENTS

| CN | 107706281 A | * | 2/2018 |
|---|---|---|---|
| JP | 2010272847 A | | 12/2010 |

(Continued)

*Primary Examiner* — Marcos D. Pizarro
*Assistant Examiner* — Antonio B Crite
(74) *Attorney, Agent, or Firm* — Hunton Andrews Kurth LLP

(57) ABSTRACT

A light emitting device including: a light emitting element, a phosphor plate, and a light guiding part. The lower face of the light emitting element has a rectangular shape. The light guiding part covers lateral faces of the light emitting element and the lower face of the phosphor plate that is exposed from the light emitting element. The light guiding part has one or more lateral faces having at least one of structures below: a height at both ends being different from the height at a central area; outer lateral faces being parallel to the lateral faces of the light emitting element.

15 Claims, 11 Drawing Sheets

(56) References Cited

U.S. PATENT DOCUMENTS

| | | | |
|---|---|---|---|
| 2013/0069104 A1* | 3/2013 | Ichikawa | H01L 33/0079 257/99 |
| 2014/0027804 A1 | 1/2014 | Yoneda et al. | |
| 2014/0322844 A1 | 10/2014 | Ichikawa et al. | |
| 2014/0374786 A1 | 12/2014 | Bierhuizen | |
| 2015/0048398 A1 | 2/2015 | Ichikawa et al. | |
| 2015/0050760 A1* | 2/2015 | Imazu | H01L 33/486 438/27 |
| 2015/0124457 A1 | 5/2015 | Sanga et al. | |
| 2015/0171281 A1 | 6/2015 | Nakabayashi et al. | |
| 2015/0340578 A1 | 11/2015 | Tamaki et al. | |
| 2016/0104824 A1* | 4/2016 | Furuyama | H01L 33/46 257/98 |
| 2016/0190406 A1* | 6/2016 | Liu | H01L 33/60 257/98 |
| 2016/0293810 A1* | 10/2016 | Baike | H01L 33/40 |
| 2016/0351766 A1* | 12/2016 | Hayashi | H01L 33/60 |
| 2018/0175267 A1* | 6/2018 | Hirasawa | H01L 23/12 |
| 2018/0275324 A1* | 9/2018 | Fujita | H01L 33/504 |

FOREIGN PATENT DOCUMENTS

| | | | |
|---|---|---|---|
| JP | 2013012545 A | 1/2013 | |
| JP | 2014027208 A | 2/2014 | |
| JP | 5482378 B2 | 5/2014 | |
| JP | 2014232866 A | 12/2014 | |
| JP | 2015029079 A | 2/2015 | |
| JP | 2015507371 A | 3/2015 | |
| JP | 2015111661 A | 6/2015 | |
| JP | 2015201665 A | 11/2015 | |
| JP | 2015207754 A | 11/2015 | |
| JP | 2015220426 A | 12/2015 | |
| JP | 2016115729 A | 6/2016 | |
| WO | 2011126000 A1 | 10/2011 | |
| WO | 2013137356 A1 | 9/2013 | |

\* cited by examiner

LIGHT EMITTING DEVICE AND METHOD OF MANUFACTURING SAME

CROSS-REFERENCE TO RELATED APPLICATION

This application claims priority to Japanese Patent Application No. 2017-059435, filed on Mar. 24, 2017, the disclosure of which is hereby incorporated by reference in its entirety.

BACKGROUND

The present invention relates to a light emitting device and a method of manufacturing the same.

Light emitting devices employing semiconductor light emitting elements, such as light emitting diodes, are widely used as light sources in place of various conventional light sources, including incandescent bulbs, fluorescent lamps, cold-cathode lamps, electric-discharge lamps, and the like. Because the applications extend in a broad range, light emitting devices suitably structured for particular applications are desired. For example, for vehicular headlamp applications, high luminance light emitting devices with reduced non-uniformity of color are desired. Japanese Patent Publication No. 5482378 discloses a light emitting device equipped with a light transmissive member which has an upper face, a lower face that is larger than the upper face, and oblique faces positioned between the upper face and the lower face, and is bonded to the light emitting element.

There is a need for a light emitting device which has reduced non-uniformity of color.

SUMMARY

The light emitting device related to certain embodiment of the present disclosure includes: a light emitting element, a phosphor plate, and a light guiding part. The light emitting element has an upper face, a lower face, lateral faces, and includes a positive electrode and a negative electrode positioned on the lower face, the light emitting element emitting light from the upper face. The phosphor plate is configured with an inorganic material containing a phosphor. The phosphor plate has an upper face, lateral faces, and a lower face that is larger than the upper face of the light emitting element and is in direct contact with the upper face of the light emitting element. The light guiding part covers the lateral faces of the light emitting element and the lower face of the phosphor plate that is exposed from the light emitting element. The lower face of the light emitting element has a rectangular shape. The light guiding part has a height hd defined in a cross section perpendicular to the lower face that includes one of the two diagonal lines of the rectangular shape at a position farthest from the light emitting element. The light guiding part has a height dc in a cross section perpendicular to the lower face that includes a line passing through an intersection of the two diagonal lines of the rectangular shape and in parallel to one side of the rectangular shape at a position farthest from the light emitting element. The height hd is different from the height hc.

A method of manufacturing a light emitting device related to certain embodiment of the present disclosure includes: arranging a plurality of light emitting elements each having an upper face, lower face, lateral faces, and including a positive electrode and a negative electrode positioned on the lower face, the light emitting element emitting light from the upper face arranged on a support so that the lower face opposes the support (A); arranging a phosphor plate that has an upper face and a lower face so that the lower face of the phosphor plate faces the upper faces of the plurality of light emitting elements, and bonding the lower face of the phosphor plate and the upper faces of the plurality of light emitting elements by direct bonding (B); subsequent to removing the support (C), arranging a light transmissive resin between the plurality of light emitting elements while orienting the phosphor plate so that the upper face of the phosphor plate is positioned at a bottom; obtaining a plurality of intermediates that each includes a light emitting element, a phosphor plate positioned on the upper face of the light emitting element, and a light guiding part formed with the light transmissive resin at the lateral faces, the plurality of intermediates obtained by cutting the phosphor plate and the light transmissive resin between the plurality of light emitting elements (D); providing a mounting board and bonding the intermediates on the mounting board (E); and forming a light reflecting part that covers lateral faces of the light guiding parts, the lateral faces of the phosphor plates, and the lateral faces and the lower faces of the light emitting elements in the intermediates (F).

According to certain embodiment of the present disclosure, a light emitting device with reduced non-uniformity of color can be provided.

DESCRIPTION

Figure 1:
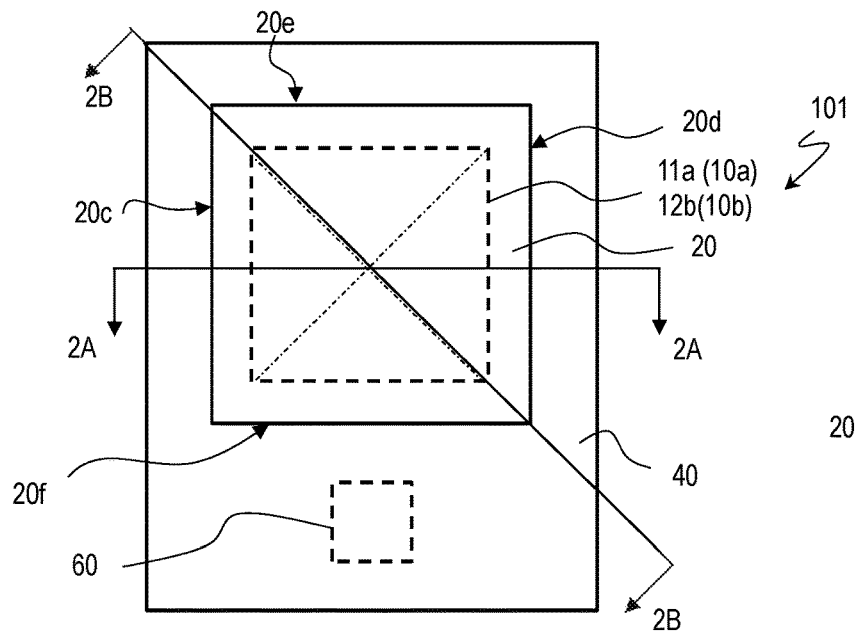
FIG. 1 is a top view of a light emitting device according to a first embodiment of the present disclosure.

Certain embodiments of the light emitting device and methods for manufacturing the same according to the present disclosure will be explained in detail below with reference to the drawings. The light emitting devices and the methods for manufacturing the same disclosed herein are exemplary, and the present invention is not limited to those light emitting devices and methods for manufacturing the same explained below. In the following explanations, terms indicating certain directions and positions (e.g., "upper," "lower," and other terms including these) might occasionally be used. The term "rectangular" and "rectangle" herein refers to a shape with a four straight sides and four right angles that includes square or approximately square. The term "bond" or "bonding" herein includes meaning of "direct joining without inter posing member such as adhesive". These terms are merely used for the purpose of showing a relative direction or position in the drawings being referenced or making the invention more easily understood.

The sizes of and positional relationships between the constituent elements shown in the drawings might be exaggerated for clarity of explanation, and might not reflect the magnitude relationships between the constituent elements in an actual light emitting device.

First Embodiment

Light Emitting Device Structure

Figure 2A:
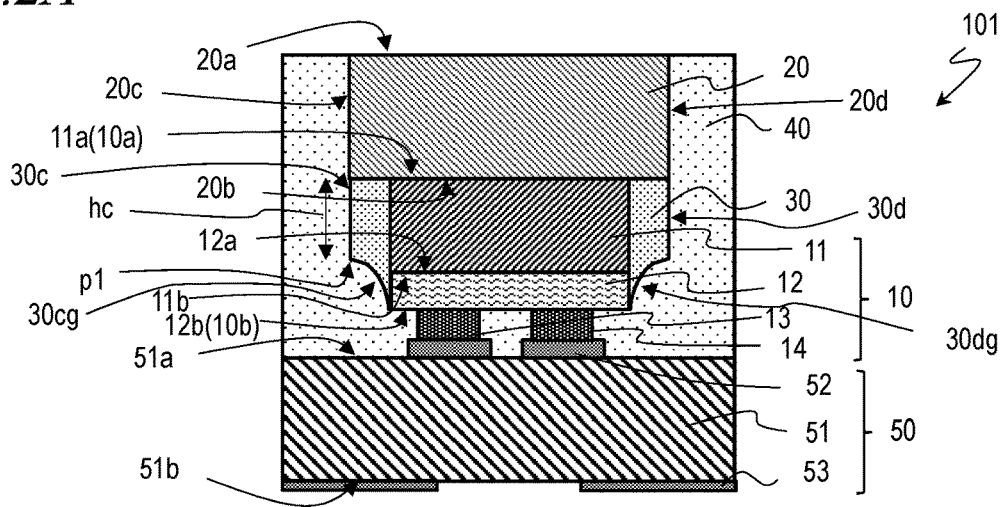
FIG. 2A is a cross-sectional view of the light emitting device taken along line 2A-2A in FIG. 1.
Figure 2B:
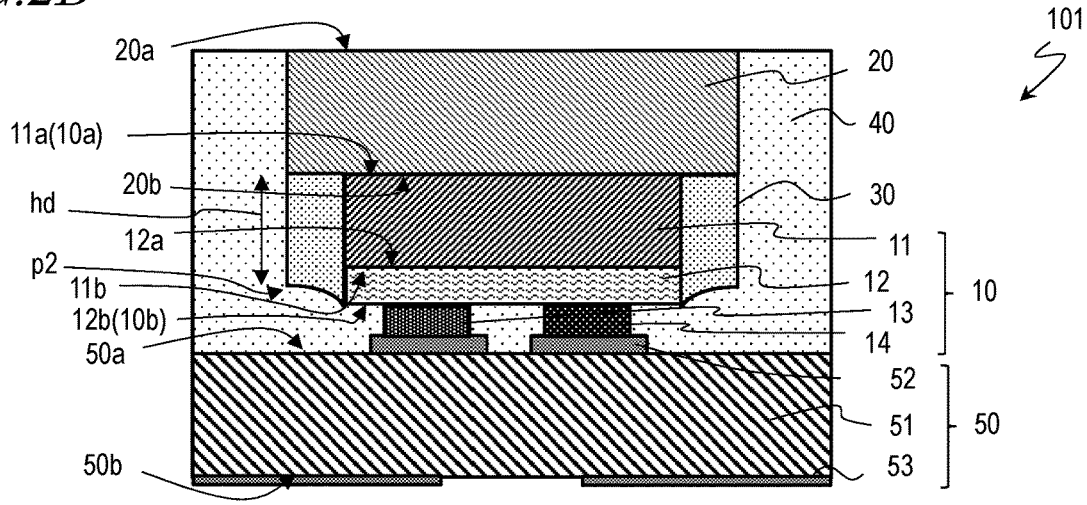
FIG. 2B is a cross-sectional view of the light emitting device taken along line 2B-2B in FIG. 1.

FIG. 1 is a top view of a light emitting device 101 according to a first embodiment of the present disclosure, FIG. 2A and FIG. 2B are cross-sectional views of the light emitting device 101 taken along lines 2A-2A and 2B-2B, respectively, in FIG. 1. The light emitting device 101 includes a light emitting element 10 having an upper face, a lower face, lateral faces, positive and negative electrodes located on the lower face side, which emits light primarily from the upper face; a phosphor plate 20 formed with an inorganic material containing at least one phosphor and having an upper face, lateral faces, and a lower face that is larger than the upper face of the light emitting element and is in direct contact with the upper face of the light emitting element; and a light guiding part 30 covering the lateral faces of the light emitting element and the lower face of the phosphor plate that is exposed from the light emitting element; and a light reflecting part 40 covering the lateral faces of the phosphor plate 20 and the light guiding part 30. In this embodiment, moreover, the light emitting device 101 includes a mounting board 50. Each constituent element will be explained in detail below.

Light Emitting Element 10

Figure 3A:
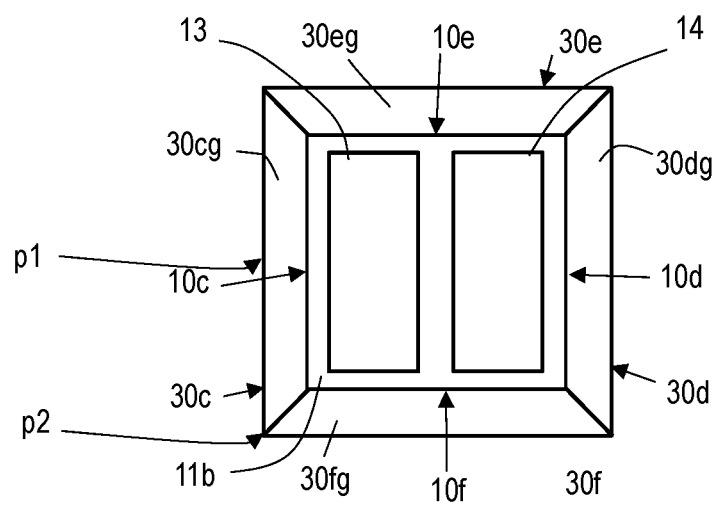
FIG. 3A is a bottom view of the structure that includes a light emitting element and a light guiding part.

The light emitting element 10 is a semiconductor light emitting element, such as a light emitting diode, and no particular restrictions on the wavelength of the emitted light are applied to the present disclosure. In this embodiment, the light emitting device 101 includes a single light emitting element 10, but may include multiple light emitting elements 10. The light emitting element 10 includes a light transmissive substrate 11, a semiconductor stack 12 formed on the light transmissive substrate 11, an positive electrode 13 and a negative electrode 14 disposed on the surface of the semiconductor stack 12. In this embodiment, the light emitting element 10 is flip chip mounted on the mounting board 50, and the light emitted from the semiconductor stack 12 exits from the light emitting element 10 through the light transmissive substrate 11. The upper faces and the lower faces of the light transmissive substrate 11 and the semiconductor stack 12 will be explained in accordance with the direction shown in FIG. 1. FIG. 3A is a bottom view of the structure that includes the light emitting element and the light guiding part. The light emitting element 10 which, as an example, is substantially quadrangular in shape in a plan view has four lateral faces 10c, 10d, 10e, and 10f. The light emitting element 10 is a rectangular parallelepiped equipped with substantially rectangular upper face 10a and lower face 10b, and four lateral faces 10c, 10d, 10e, and 10f positioned between the upper face 10a and the lower face 10b.

The light transmissive substrate 11 is a substrate for the epitaxial growth of and supporting the semiconductor stack 12. The light transmissive substrate 11 has an upper face 11a and a lower face lib opposing the upper face 11a. As described later, in the case where the semiconductor stack 12 is configured with nitride-based semiconductors, a light transmissive insulating substrate, such as sapphire ($Al_2O_3$), spinel ($MgAl_2O_4$), or the like, or a semiconductor substrate, such as a nitride semiconductor, can be used for the light transmissive substrate 11. "Light transmissivity" here refers to the property of a material of transmitting at least 60%, preferably at least about 80% of the light emitted from the light emitting element 10.

The semiconductor stack 12 is located on the lower face lib side of the light transmissive substrate 11 in FIG. 2A. The Semiconductor stack 12 includes a plurality of stacked semiconductor layers. For example, the semiconductor stack 12 includes a first conductive semiconductor layer (e.g., n-type semiconductor layer) and a second conductive semiconductor layer (e.g., p-type semiconductor layer) and a light emission layer (i.e., active layer) interposed between the first conductive semiconductor layer and the second conductive semiconductor layer. The light emitting element 10 emits light having a wavelength corresponding to the bandgap of the light emission layer. A semiconductor layer capable of emitting ultraviolet light or blue to green visible light can be formed by using a semiconductor material, for example, a Group III-V compound semiconductor, Group II-VI compound semiconductor, and the like. Specifically, a semiconductor stack 12 composed of nitride-based semiconductor materials having a composition of $In_XAl_YGa_{1-X-Y}N$ ($0 \leq X$, $0 \leq Y$, $X+Y \leq 1$) or the like can be used. The upper face 12a of the semiconductor stack 12 is in contact with the lower face 11b of the light transmissive substrate 11, and the light emitted by the light emission layer enters from the upper face 12a of the semiconductor stack 12 into the light transmissive substrate 11, and exits from the light emitting element 10 through the upper face 11a and the lateral faces of the light transmissive substrate 11.

A positive electrode 13 and a negative electrode 14 is disposed on the lower face 12b of the semiconductor stack 12. The positive electrode 13 and the negative electrode 14 are electrically connected to the first conductive semiconductor layer and the second conductive semiconductor layer, respectively. A voltage is applied to the light emission layer from the positive electrode 13 and the negative electrode 14 via the first conductive semiconductor layer and the second conductive semiconductor layer.

The positive electrode 13 and the negative electrode 14 are configured with a known metal material electrically connectable to the semiconductor stack 12. For example, a metal, such as Cu, Au, Ag, AuSn, or the like, can be used. The positive electrode 13 and the negative electrode 14 may each be of a single or multilayer structure.

The upper face 11a of the light transmissive substrate 11 and the lower face 12b of the semiconductor stack 12 are concurrently the upper face 10a and the lower face 10b of the light emitting element 10. As described above, the upper face 10a of the light emitting element 10 (i.e., the upper face 11a of the light transmissive substrate 11) and the lower face 10b of the light emitting element 10 (i.e., the lower face 12b of the semiconductor stack 12) are substantially rectangular in shape in a plan view.

Phosphor Plate 20

The phosphor plate 20 converts the wavelength of at least a portion of the light entering from the light emitting element 10 before the light exits from the phosphor plate 20. The phosphor plate 20 has an upper face 20a and a lower face 20b that opposes the upper face 20a. The lower face 20b of the phosphor plate 20 is in direct contact with the upper face 10a of the light emitting element 10. As described later, the lower face 20b of the phosphor plate 20 and the upper face 10a of the light emitting element 10 are bonded by direct bonding. Direct bonding refers to the form of bonding which uses no additional bonding materials such as an adhesive where the atoms of the materials exposed at the interface are to be bonded with one another. The absence of the intervening material such as an adhesive layer between the phosphor plate 20 and the light emitting element 10 achieves good thermal conductivity between the light emitting element 10 and the phosphor plate 20. It is thus possible to allow the heat generated at the phosphor plate 20 to transfer to the mounting board 50 via the light emitting element 10, or the heat generated at the light emitting element 10 to transfer to the phosphor plate 20, thereby improving the thermal conductivity within the light emitting device 101. The lower face 20b of the phosphor plate 20 and the upper face 10a of the light emitting element 10 preferably have a high level of smoothness so that strong adhesion can be achieved in the direct bonding. Specifically, the smoothness is preferably an arithmetic average roughness Ra of 1 nm at most.

The upper face 20a and the lower face 20b of the phosphor plate 20 are preferably substantially in parallel to one another. "Substantially parallel" herein means that a tolerance of a tilt of one surface relative to the other surface of about ±5° is acceptable. Such a shape can achieve a light emitting device 101 which has uniform front face luminance with reduced non-uniformity of emission color at the upper face 20a of the phosphor plate 20 which serves as the emission face. The thickness of the phosphor plate 20 that is the height from the lower face 20b to the upper face 20a of the phosphor plate 20 is, for example, in a range of from about 50 μm to about 300 μm. As shown in FIG. 1, FIG. 2A and FIG. 2B, the lower face 20b of the phosphor plate 20 is larger than the upper face 10a of the light emitting element 10. In a plan view, the phosphor plate 20 has a substantially rectangular shape. The outer perimeter of the lower face 20b of the phosphor plate 20 is located on the outside of the outer perimeter of the upper face 10a of the light emitting element 10.

As shown in drawings, such as FIG. 1 and FIG. 2, the phosphor plate 20 has lateral faces 20c, 20d, 20e, and 20f. The lateral faces 20c, 20d, 20e, and 20f are preferably flat and substantially perpendicular to the upper face 20a of the phosphor plate 20. That is, the phosphor plate 20 is preferably a rectangular parallelepiped having an upper face 20a and a lower face 20b which have substantially the same rectangular shape, and four lateral faces 20c, 20d, 20e, and 20f located between the upper face 20a and the lower face 20b. This clearly defines the boundaries between the emission part and non-emission part when viewed perpendicular to the upper face 20a of the phosphor plate 20 which is the emission face of the light emitting device 101 because the boundaries between the phosphor plate 20 and the light reflecting part 40 surrounding the phosphor plate 20 described later are positioned perpendicular to the emission face. "Substantially perpendicular" herein means that a tolerance of an angle formed between one surface and the other surface of about 90°±5° is acceptable.

The phosphor plate 20 contains a phosphor which emits light after converting the wavelength of at least a portion of the light entering from the light emitting element 10. Containing a phosphor in the phosphor plate 20 makes the light exiting from the upper face 20a of the phosphor plate 20 mixed light of the emitted light from the light emitting element 10 and the light whose wavelength has been converted by the phosphor. For example, the light emitting device 101 emitting white light by combining blue light emitted from a light emitting element 10 and yellow light which is a portion of the blue light that has undergone wavelength conversion by the phosphor can be obtained.

The phosphor plate 20 is configured with, for example, a sintered body of a phosphor, or an inorganic material, such as a ceramic, glass, or the like, which contains phosphor powder. The phosphor that is excitable by the light emitted from the light emitting element 10 is used. For example, one of the specific examples listed below can be used singly, or two or more can be used in combination. Specific examples of phosphors excitable by light emitted from a blue light emitting element or ultraviolet light emitting element include cerium-activated yttrium aluminum garnet-based phosphors (e.g., $Y_3(Al,Ga)_5O_{12}$:Ce); cerium-activated lutetium aluminum garnet-based phosphors (e.g., $Lu_3(Al,Ga)_5O_{12}$:Ce); europium- and/or chromium-activated nitrogen-containing calcium aluminosilicate (e.g., $CaO-Al_2O_3-SiO_2$:Eu); europium-activated silicate-based phosphors (e.g., $(Sr,Ba)_2SiO_4$:Eu); nitride-based phosphors, such as ß-SiAlON phosphors (e.g., $Si_{6-z}Al_zO_zN_{8-z}$:Eu ($0<Z<4.2$)); nitride-based phosphor, such as CASN-based phosphors (e.g., $CaAlSiN_3$: Eu), and SCASN-based phosphors (e.g., $(Sr,Ca)AlSiN_3$:Eu); manganese-activated potassium flurorosilicate phosphors ($K_2SiF_6$:Mn); sulfide-based phosphors;

and quantum dot phosphors. By combining these phosphors and a blue light emitting element or ultraviolet light emitting element, a light emitting device of a given emission color (e.g., a light emitting device emitting white light) can be produced. For example, a light emitting device 101 which emits white light can be obtained by adjusting the type and concentration of the phosphor contained in the phosphor plate 20. The content of the phosphor in the phosphor plate 20 is, for example, about 5 to 50% by mass.

The phosphor plate 20 may include a light diffuser in addition to the phosphor. As the light diffuser, for example, titanium oxide, barium titanate, aluminum oxide, silicon oxide, or the like can be used. Containing only inorganic materials in the phosphor plate 20, in other words, containing no organic materials, can increase the thermal conductivity of the phosphor plate 20 thereby enhancing heat dissipation. This also increases the refractive index of the phosphor plate 20 as compared to one including an organic material, which reduces the refractive index difference from that of the light transmissive substrate 11 as well as reducing reflection at the interface between the light emitting element 10 and the phosphor plate 20, thereby increasing the emission efficiency of the phosphor plate 20.

Light Guiding Part 30

As shown in FIG. 2A, FIG. 2B, and FIG. 3A, the light guiding part 30 covers the lateral faces 10c, 10d, 10e, and 10f of the light emitting element 10 and the lower face 20b of the phosphor plate, and guides the light emitted from the lateral faces 10c, 10d, 10e, and 10f of the light emitting element 10 into the phosphor plate 20. For this purpose, the light guiding part 30 covers at least part of the lateral faces 10c, 10d, 10e, and 10f of the light emitting element 10 and at least part of the portion of the lower face 20b of the phosphor plate 20 that is exposed from the light emitting element 10. Preferably, the light guiding part 30 surrounds the lateral faces 10c, 10d, 10e, and 10f of the light emitting element 10, and entirely covers the lateral faces 10c, 10d, 10e, and 10f of the light emitting element 10. Also preferably, the light guiding part 30 covers the lower face 20b of the phosphor plate 20 at an entire area that is exposed from the light emitting element 10.

Figure 3B:
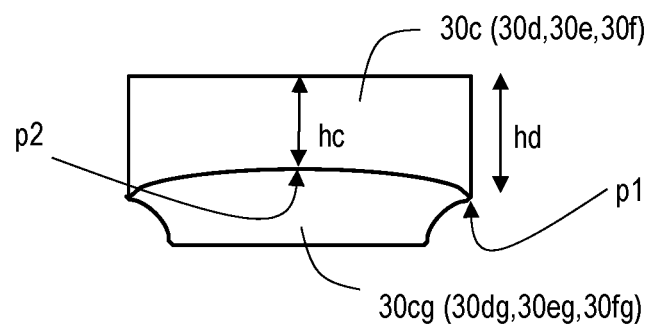
FIG. 3B is a lateral side view showing a first lateral face and a second lateral face contiguous with the first lateral face of the light guiding part.

The light guiding part 30 has first lateral faces 30c, 30d, 30e, and 30f that are in contact with the lower face of the phosphor plate 20, and second lateral faces 30cg, 30dg, 30eg, and 30fg that are connected from the respective first lateral faces to the lateral faces 10c, 10d, 10e, and 10f of the light emitting element 10. FIG. 3B is a side view showing the first lateral face 30c and the second lateral face 30cg of the light guiding part 30. The first lateral faces 30c, 30d, 30e, and 30f of the light guiding part 30 are preferably substantially flat faces being in contact with the lower face perimeter of the phosphor plate 20, and the second lateral faces are preferably oblique faces being in contact with the lower face perimeter of the light emitting element 10. Furthermore, the first lateral faces are preferably flat faces substantially in parallel to the lateral faces of the light emitting element 10, and the second lateral faces are preferably curved faces concave towards the light reflecting part 40 described later. Such a shape allows the outer faces of the light guiding part 30 to form appropriate reflective surfaces in combination with the light reflecting part 40, so that the light exiting form the lateral faces of the light emitting element 10 can be reflected at the light reflecting part 40, and the reflected light can be guided into the phosphor plate 20. Particularly, the first lateral faces of the light guiding part 30 substantially in parallel to the lateral faces of the light emitting element 10 being in contact with the lower face perimeter of the phosphor plate can reduce the incident angle of light even in the peripheral portion of the phosphor plate that is exposed from the upper face 10a of the light emitting element 10 (i.e., can increase the percentage of the light entering perpendicularly), thereby improving the light extraction efficiency.

The first lateral faces 30c, 30d, 30e, and 30f of the light guiding part 30 have different heights depending on the position. This will be explained with reference to two cross-sectional views. FIG. 2A shows a cross section that is perpendicular to the substantially rectangular lower face 10b of the light emitting element 10 in a plan view, and includes a line which passes through the intersection of the two diagonal lines indicated by the one-dot chain lines in FIG. 1 of the rectangular lower face 10b and is in parallel to one side of the rectangle. Hereinafter, this cross section is referred to as the 2A-2A cross section. FIG. 2B is a cross section that is perpendicular to the lower face 10b and includes one of the diagonal lines of the rectangular lower face 10b of the light emitting element 10 in a plan view. Hereinafter, this cross section is referred to as the 2B-2B cross section.

The height hc of the light guiding part 30 at position p1 which is farthest from the light emitting element 10 in the 2A-2A cross section and the height hd of the light guiding part 30 at position p2 which is farthest from the light emitting element 10 in the cross section 2B-2B are different from one another. As shown in FIG. 3B, the height hd is the height of the light guiding part 30 at both ends of each first lateral face, and the height hc is the height in the center of each first lateral face. In this embodiment, hd is greater than hc, i.e., hd>hc.

As shown in FIG. 3A, in a plan view, the distance between position p2 and respective of the lateral faces 10c and 10f of the light emitting element 10 is longer than the distance between position p1 and the lateral face 10c. This readily reduces the amount of light (and the optical density) incident from the light emitting element 10 in the four corners and their vicinities of the phosphor plate 20 in a plan view compared to the remaining part. As a result, the amount of light entering from the light emitting element 10 declines near the four corners of the upper face 20a of the phosphor plate 20, readily lowering the luminance at the four corners and their vicinities of the rectangular emission face as compared to the remaining part. Moreover, when emitting white light from the emission face of the phosphor plate 20 by mixing colors, for example, the balance of light of two or more colors being mixed would differ in the four corners from the remaining part because of the reduced amount of light entering from the light emitting element 10. The consequential color differences in the four corners from that of the remaining part on the emission face readily cause color non-uniformity.

In this embodiment, color non-uniformity is attenuated by providing a larger height hd at position p2 than the height hc at position p1, allowing the reflection characteristics of the light emitted from the lateral faces 10c to 10f of the light emitting element 10 using the light guiding part 30 near the four corners and their vicinities of the phosphor plate 20 to differ from those in the remaining part. Specifically, the height of each of the first lateral faces 30c to 30f of the light guiding part 30 near both ends which correspond to the four corners and their vicinities of the phosphor plate 20 is set greater than the height of the central area, and the height of each of the second lateral faces 30cg to 30fg near both ends is set smaller than the height of the central area. The height of each of the second lateral face 30cg to 30fg is a distance of the light guiding part 30 in the same direction as the height hd or hc. This can reduce the rate of the light exiting from the lateral faces of the light emitting element 10 being reflected near both ends of each of the second lateral faces 30cg to 30fg and entering the light emitting element, while increasing the percentage of the light directly entering the first lateral faces 30c to 30f and being reflected towards the phosphor plate 20 as well as increasing the percentage of the light reflected by the second lateral faces 30cg to 30fg, entering the first lateral faces and traveling towards the phosphor plate 20. This can compensate for the deficiency in the amount of light entering near the four corners of the phosphor plate 20, thereby attenuating the luminance decline and reducing color non-uniformity at the four corners and their vicinities of the emission face of the light emitting element 10.

For the light guiding part 30, a resin member is preferably used from the perspective of easy handling and processing. For the resin member, one composed of a resin containing one or more types of silicone resins, modified silicone resins, epoxy resins, modified epoxy resins, acrylic resins, and fluorine resins, or a hybrid resin can be used. The light guiding part 30 having different heights hd and hc can be formed by utilizing the viscosity of the uncured resin material (which is the raw material for the resin member for forming the light guiding part 30), the wettability of the resin material with the lateral faces of the light emitting element 10, and the contraction of the resin material when cured as described later.

The light guiding part 30 may contain a phosphor. In this case, the phosphor, for example, is localized in the part of the light guiding part 30 that is close to the phosphor plate 20. One or more phosphors can be selected from the various phosphors described earlier.

Light Reflecting Part 40

The light reflecting part 40 covers the lateral faces 20c, 20d, 20e, and 20f of the phosphor plate 20, and the light guiding part 30. This allows the light emitted from the light emitting element 10 to be reflected by the interfaces between the light reflecting part 40 and the light guiding part 30, and between the light reflecting part 40 and the phosphor plate 20, towards the phosphor plate 20 and the light guiding part 30 to be ultimately exiting from the upper face 20a of the phosphor plate 20. In the case where parts of the lateral faces of the light emitting element 10 are not covered by the light guiding part 30, the lateral face parts not covered by the light guiding part 30 are preferably also covered by the light reflecting part 40.

In the case where the light emitting element 10 is arranged on a mounting board 50, the light reflecting part 40 preferably fills an area between the light emitting element 10 and the substrate 50.

The light reflecting part 40 is formed with a material that can reflect the light emitted from the light emitting element 10. Specifically, it can be formed by adding a light reflecting substance to a resin member similar to that used for the light guiding part 30 described above. Examples of the light reflecting substance include titanium oxide, silicon oxide, zirconium oxide, yttrium oxide, yttria-stabilized zirconia, potassium titanate, alumina, aluminum nitride, boron nitride, mullite, and the like. The light reflecting substance content in the light reflecting part 40 is preferably, for example, 30 to 60 parts by weight, particularly preferably 45 to 60 parts by weight, relative to 100 parts by weight of the resin member which is the base material. This is preferable because leakage of light from the light emitting device can be more effectively reduced.

Mounting Board 50

The mounting board 50 supports the light emitting element 10. The mounting board 50 may include wiring for supplying electric power to the light emitting element 10 and external terminals for connecting the light emitting element 10 to an external circuit. In this embodiment, the mounting board 50 includes a base 51 having a plate-like shape, wiring 52 formed on the upper face 51a of the base 51, and external terminals 53 formed on the lower face 51b of the base 51. The wiring 52 is electrically connected to the positive electrode 13 and the negative electrode 14 of the light emitting element 10. The wiring 52 is electrically connected to the external terminals 53 using, for example, via holes and via conductors provided in the base 51.

Examples of the materials for the base 51 include insulating materials such as glass epoxy, resins, ceramics, and metal materials on which an insulating member is formed. Especially, a highly heat and weather resistant ceramic material is preferably used for the base 51. Examples of ceramic materials include alumina, aluminum nitride, mullite. These ceramic materials may be combined with an insulating material, for example, BT resin, glass epoxy, epoxy-based resins.

The wiring 52 and external terminals 53 can be formed with metals, such as copper, aluminum, gold, silver, platinum, titanium, tungsten, palladium, iron, nickel, or the like, or alloys containing these metals. Moreover, the outermost surface of the wiring 52 is preferably covered with a high light reflectance material, such as silver or gold, to efficiently extract light from the light emitting element 10. The wiring 52 can be formed by electroplating, electroless plating, vapor deposition, sputtering, or the like. In the case of employing Au bumps for mounting a light emitting element on a mounting board, for example, using Au at the outermost surface of the wiring can improve the adhesiveness between the light emitting element and the mounting board. Such a mounting board is known in the art, and such any mounting board for use in mounting electronic parts (e.g., light emitting elements) can be used.

Protective Device 60

The light emitting device 101 may include a protective device 60 such as a Zener diode. For example, as indicated by broken lines in FIG. 1, the protective device 60 can be embedded in the light reflecting part 40. Embedding the protective device 60 in the light reflecting part 40 can attenuate the light extraction decline attributable to absorption or blocking of the light from the light emitting element 10 by the protective device 60.

Method of Manufacturing Light Emitting Device

One embodiment of the method of manufacturing a light emitting device of the present disclosure will be explained below with reference to the drawings. The method of manufacturing a light emitting device includes: arranging a plurality of light emitting elements on a support (A); bonding a phosphor plate and the plurality of light emitting elements (B); providing a light transmissive resin between the plurality of light emitting elements (C); obtaining intermediates each equipped with a light guiding part (D); bonding the intermediates to a mounting board (E); and forming a light reflecting part (F). Each step will be explained in detail below.

(A) Arranging Light Emitting Elements on Support

Figure 4A:
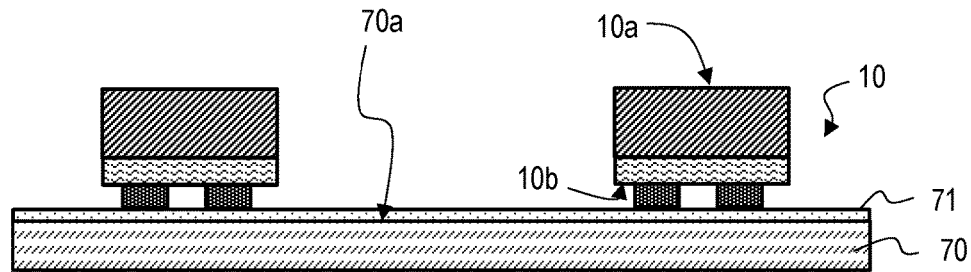
FIG. 4A is a cross-sectional view showing a manufacturing step in a method of manufacturing a light emitting device according to the first embodiment of the present disclosure.

First, a plurality of light emitting elements 10 are arranged on a support. As shown in FIG. 4A, light emitting elements 10 are arranged on a support 70 including, for example, an adhesive layer 71 formed thereon. The support 70 can simply have a flat upper face, and be a plate-like mounting board made of various materials can be used. For example, a Si mounting board can be used. An adhesive layer 71 is formed in order to temporarily attach the light emitting elements 10 to the upper face of the support 70. The adhesive layer 71 is formed, for example, by applying an uncured silicone resin on the upper face of the support 70 by spin coating and curing the resin.

Then, the light emitting elements 10 are arranged so that the lower faces 10b face the support 70, and the light emitting elements 10 are adhered to the support 70 via the adhesive layer 71. The light emitting elements 10 can be placed by employing, for example, a chip mounter.

Figure 4B:
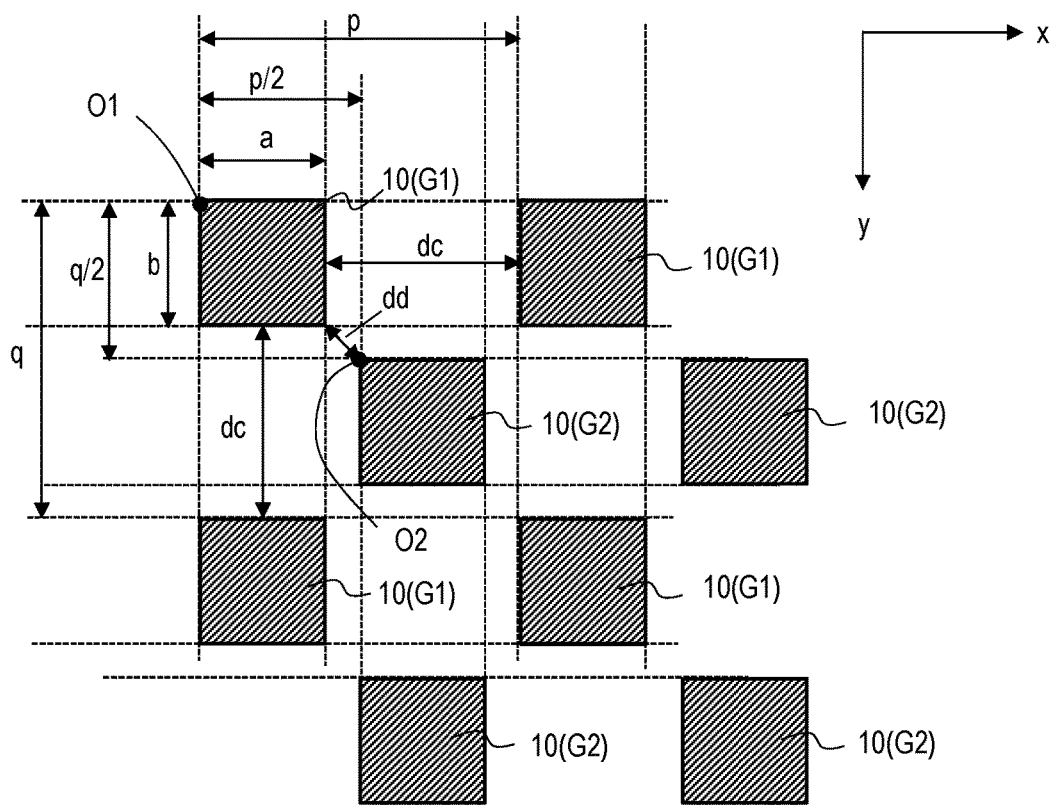
FIG. 4B is a view showing the layout of the light emitting elements in the method of manufacturing a light emitting device according to the first embodiment of the present disclosure.

FIG. 4B shows a layout example of the light emitting elements 10 on the support 70. The upper face 10a and the lower face 10b of each light emitting element 10 are rectangular in shape. The lengths of two adjacent sides are denoted by a and b. In FIG. 4B, a plurality of light emitting elements 10 are arranged on the support 70 where the positions of the light emitting elements 10 are indicated by their upper faces 10a. A first direction and a second direction are defined along two adjacent sides of the upper face 10a of a light emitting element 10. For example, x direction and y direction are defined as the first direction and second direction, respectively.

The light emitting elements 10 are arranged on the support 70 using a layout referred to as an alternating, staggered, or checkerboard layout. For example, the layout of the light emitting elements 10 can be explained by dividing them into two groups. Specifically, the light emitting elements 10 are divided into first and second groups G1 and G2. In FIG. 4B, the light emitting elements 10 in the first group G1 are denoted as 10 (G1), and the light emitting elements 10 in the second group G2 are denoted as 10 (G2). On the flat face of the support 70, a given point is defined as a reference point O1 for the first group, and the light emitting elements 10 in the first group G1 are arranged two dimensionally at pitch p in the first direction (i.e., x direction) along the side having length a and at pitch q in the second direction (i.e., y direction) along the side having length b from the reference point O1. Here, p and q are real numbers satisfying the inequities, $2a<p$ and $2b<q$. A pitch refers to a repeated length in the layout. The light emitting elements 10 in the second group G2 are arranged two dimensionally from the second group's reference point O2, which is p/2 and q/2 in the first and second directions away from the first group's reference point O1, at pitch p in the first direction (i.e., x direction) along the side having length a and at pitch q in the second direction (i.e., y direction) along the side having length b. Arranging the light emitting elements 10 in this manner makes the intervals dd between the light emitting elements 10 in the direction of a diagonal line of the upper faces 10a of the light emitting elements 10 smaller than the intervals dc in the first and second directions.

(B) Bonding a Phosphor Plate and Light Emitting Elements

Figure 4C:
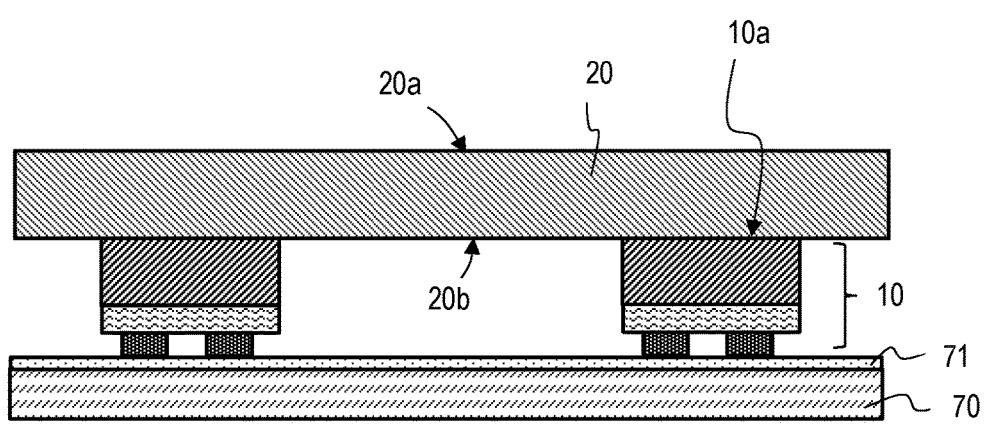
FIG. 4C is a cross-sectional view showing a manufacturing step in the method of manufacturing a light emitting device according to the first embodiment of the present disclosure.

As shown in FIG. 4C, a phosphor plate 20 is bonded to the light emitting elements 10 arranged as described above. Specifically, the phosphor plate 20 is placed relative to the light emitting elements 10 so that the lower face 20b of the phosphor plate 20 faces the upper faces 10a of the light emitting elements 10, and the lower face 20b of the phosphor plate 20 and the upper faces 10a of the light emitting elements 10 are bonded by direct bonding.

The direct bonding suited for this embodiment is preferably one that is generally categorized as room temperature bonding. Examples include surface activated bonding, atomic diffusion bonding, hydroxyl bonding. Surface activated bonding is performed by cleaning and activating surfaces by irradiating inactive ions against the bonding interface in an ultra-high vacuum environment, as disclosed, for example, in WO 2011/126000. Atomic diffusion bonding is performed by sputtering a metal in an ultra-high vacuum environment utilizing the diffusion of the metal. It has been confirmed that bonding can be achieved without affecting light extraction by forming a very thin metal film by sputtering as disclosed, for example, in Japanese Unexamined Patent Application Publication No. 2015-29079. In the case of atomic diffusion bonding, the light emitting elements 10 and the phosphor plate 20 would be bonded via a metal layer that is too thin to affect light extraction. In this specification, the light emitting elements 10 and the phosphor plate 20 are considered to be bonded by direct bonding even by way of atomic diffusion bonding. Hydroxyl bonding bonds the light emitting elements 10 and the phosphor plate 20 by forming hydroxy groups at the bonding interface and utilizing hydrogen bonds between the hydroxy groups, as disclosed, for example, in Japanese Unexamined Patent Application Publication No. 2014-232866. These bonding methods are categorized as room temperature bonding, but a heat treatment may be performed as needed to increase the bonding strength. In this case, the heating temperature is 400° C. at most, preferably 300° C. at most, more preferably 200° C. at most.

For better bonding between the phosphor plate 20 and the light emitting elements 10, the smaller the surface roughness of the lower face 20b of the phosphor plate 20 as well as the upper faces 10a of the light emitting elements 10, the more preferably it is. For example, the lower face 20b of the phosphor plate 20 as well as the upper faces 10a of the light emitting elements 10 preferably have the arithmetic surface roughness Ra of 1 nm at most.

In the case of bonding the phosphor plate 20 and the light emitting elements 10 by surface activated bonding, for example, the upper surfaces 10a of the light emitting elements 10 arranged on the support 70 are cleaned and dried, followed by activating the upper surfaces 10a of the light emitting elements 10 and the lower face 20b of the phosphor plate 20 by exposing them to inert gas plasma, and bringing the light emitting elements 10 into contact with the lower face 20b of the phosphor plate 20 to be bonded.

(C) Disposing a Light Transmissive Resin Between the Plurality of Light Emitting Elements After bonding the phosphor plate 20 to the arranged light emitting elements 10, the support 70 is removed. The bond between the light emitting elements 10 and the support 70 achieved by the bonding layer 71 is a temporary bond to secure the light emitting elements 10 in a given layout, and the bonding strength is weaker than the direct bonding. Thus, the support 70 can be easily separated.

Figure 4D:
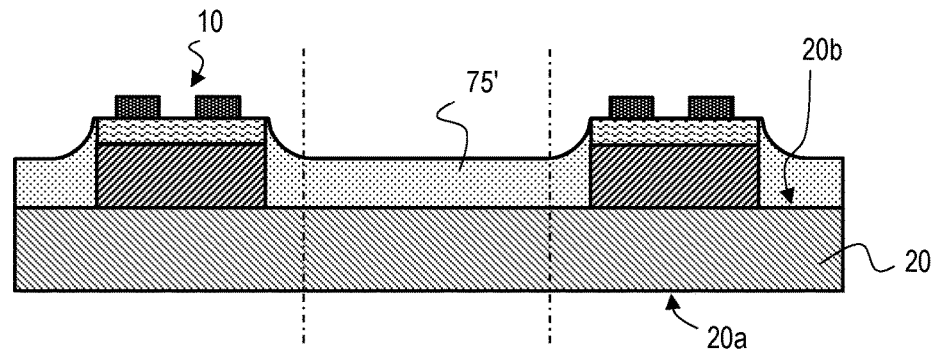
FIG. 4D is a cross sectional view showing a manufacturing step in the method of manufacturing a light emitting device according to the first embodiment of the present disclosure.
Figure 4E:
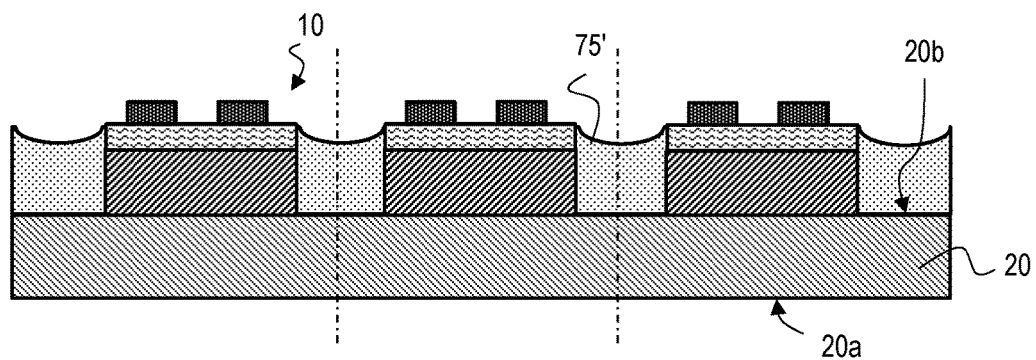
FIG. 4E is a cross-sectional view showing a manufacturing step in the method of manufacturing a light emitting device according to the first embodiment of the present disclosure.

FIG. 4D is a cross section of the light emitting elements 10 bonded to the phosphor plate 20 taken along the first direction (i.e., x direction) in FIG. 4B. FIG. 4E is a cross section taken along the direction of a diagonal line in the upper face 10a of the light emitting elements 10. As shown in FIG. 4D and FIG. 4E, a light transmissive resin which will serve as the light guiding part 30 is disposed between the light emitting elements 10 while the upper face 20a of the phosphor plate 20 is positioned at the bottom side of FIGS. 4D and 4E. Specifically, the uncured light transmissive resin material that is the raw material for the light guiding part 30 is disposed on the lower face 20b of the phosphor plate 20 between the light emitting elements 10 by potting or the like. At this time, the uncured resin material 75 creeps up the lateral faces of the light emitting elements 10 due to surface tension to have a concave shape with respect to the upper side of FIGS. 4D and 4E in each region where the uncured resin material is dripped.

Subsequently, the uncured resin material 75 is cured by heating. The cured light transmissive resin 75', as shown in FIG. 4D and FIG. 4E, forms a concave meniscus in each region. Here, as shown in FIG. 4E, since the distances between adjacent light emitting elements 10 are short in the direction of a diagonal line of the upper face 10a, the height of the light transmissive resin 75' between the light emitting elements 10 is not reduced much. On the other hand, as shown in FIG. 4D, the distances between adjacent light emitting elements are long in the first direction and the second direction along the two sides of the upper faces 10a of the light emitting elements 10. Thus, the height of the light transmissive resin 75' between the light emitting elements 10 becomes small. This forms a light transmissive resin satisfying the height relationship hd>hc.

(D) Obtaining Intermediates Equipped with Light Guiding Parts

Figure 4F:
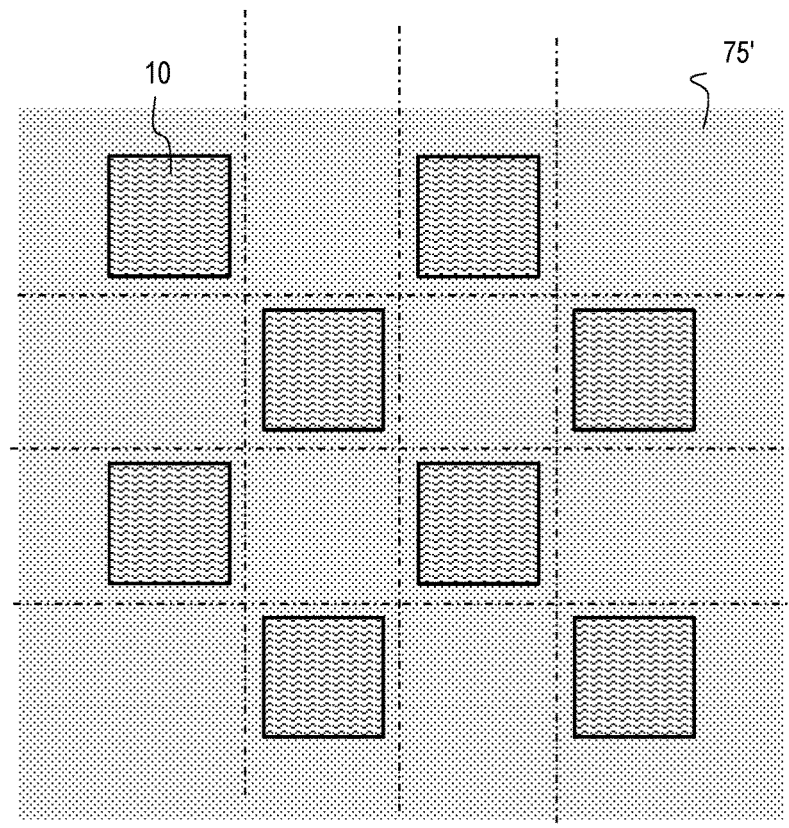
FIG. 4F is a view showing the positions where the phosphor plate to which a plurality of light emitting elements are bonded is cut in the method of manufacturing a light emitting device according to the first embodiment of the present disclosure.

Subsequently, as shown in FIG. 4D, FIG. 4E, and FIG. 4F, the light emitting elements 10 are separated. By cutting the phosphor plate 20 and the light transmissive resin 75' along the one-dot chain lines indicated in FIG. 4D, FIG. 4E, and FIG. 4F, multiple intermediates 80 are obtained each including at least one light emitting element 10. The intermediates 80 each have a configuration that a light guiding part 30 made of a light transmissive resin is positioned at the lateral faces of the light emitting element 10.

(E) Bonding Intermediates to Mounting Board

Figure 4G:
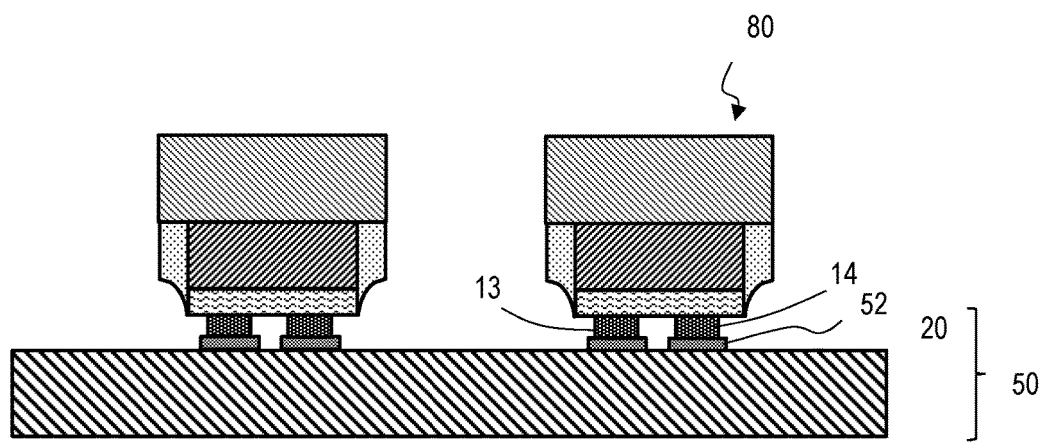
FIG. 4G is a cross-sectional view showing a manufacturing step in the method of manufacturing a light emitting device according to the first embodiment of the present disclosure.
Figure 4H:
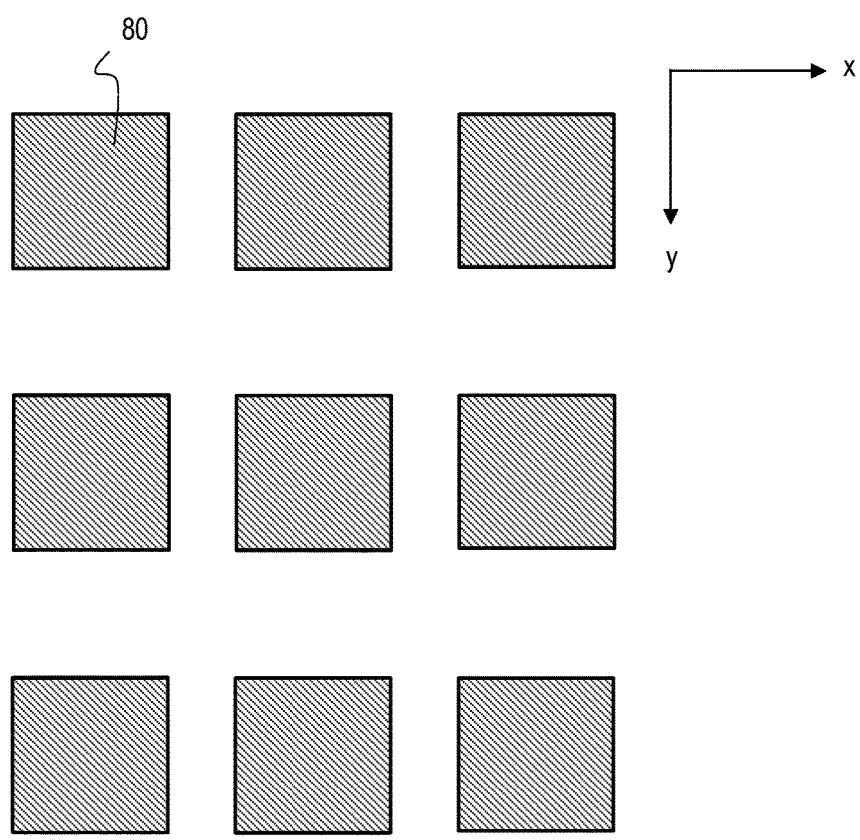
FIG. 4H is a view showing the layout of the intermediates in the method of manufacturing a light emitting device according to the first embodiment of the present disclosure.

As shown in FIG. 4G, by preparing a mounting board 50 and electrically connecting the positive electrodes 13 and negative electrodes 14 of the intermediates 80 to the wiring 52 of the mounting board 50, the intermediates 80 are joined to the mounting board 50. At this time, the intermediates 80 may be two-dimensionally arranged on the mounting board 50, for example, along the first direction (x direction) and the second direction (y direction) as shown in FIG. 4H. Alternatively, a number of intermediates 80 corresponding to the number of light emitting elements 10 included in a light emitting device 101 may be joined to the mounting board 50.

(F) Forming a Light Reflecting Part

Figure 4I:
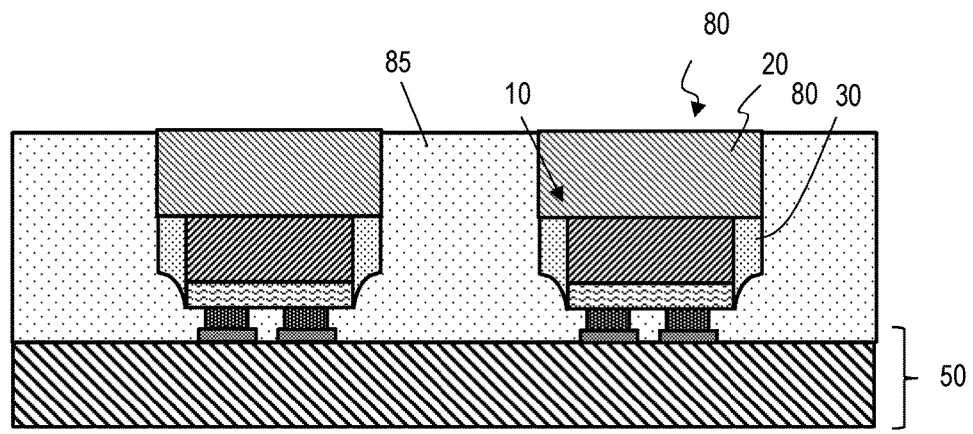
FIG. 4I is a cross-sectional view showing a manufacturing step in the method of manufacturing a light emitting device according to the first embodiment of the present disclosure.

As shown in FIG. 4I, an uncured material 85 that is the raw material for the light reflecting part 40 is disposed between the intermediates 80 arranged on the mounting board 50 and cured. This step can be accomplished, for example, by injection molding, potting, printing, transfer molding, compression molding.

Figure 4J:
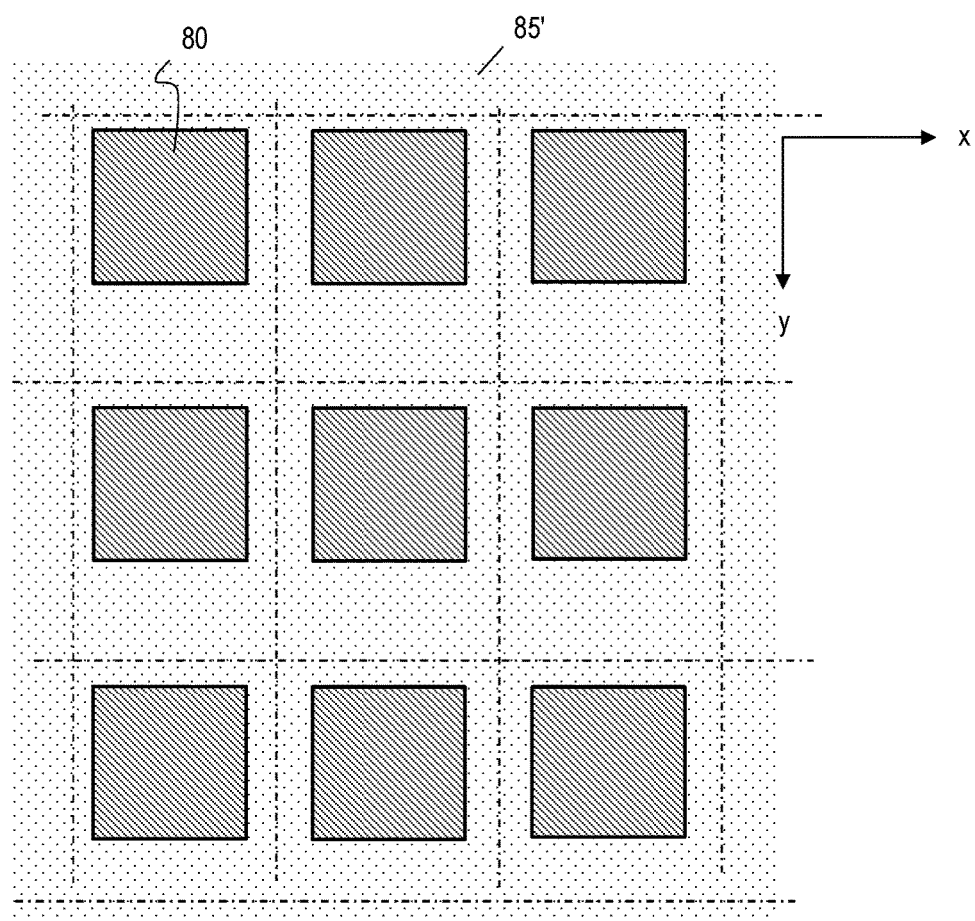
FIG. 4J is a diagram showing the cutting positions to divide into individual light emitting devices in the method of manufacturing a light emitting device according to the first embodiment of the present disclosure.

This forms a light reflecting resin 85' that covers the lateral faces of the light guiding parts 30 and the phosphor plate 20, as well as the lower faces of the light emitting elements 10 of the intermediates 80. Subsequently, as shown in FIG. 4J, light emitting devices 101 are completed by being divided by cutting the light reflecting resin 85' and the mounting board 50.

According to the light emitting device 101 of the present disclosure, the light guiding part 30 covers the lateral faces 10c, 10d, 10e, and 10f of the light emitting elements 10. In addition, the light guiding part 30 also covers the part of the lower face 20b of the phosphor plate 20 that is not in contact with the upper face 10a of the light emitting elements 10, in other words, the lower face 20b of the phosphor plate 20 exposed from the light emitting element 10. This allows the light exiting from the upper face 10a and the lateral faces 10c, 10d, 10e, and 10f of the light emitting elements 10 to enter the lower face 20b of the phosphor plate 20 across its entire surface, thereby enabling color mixing of the light entering from the light emitting element 10 and the light which has undergone wavelength conversion by the phosphor contained in the phosphor plate 20 by utilizing the entire phosphor plate 20. The mixed color light exits from across the entire upper face 20a of the phosphor plate 20, which is the emission face of the light emitting device 101, thereby reducing color non-uniformity at the emission face.

Furthermore, the light emitting device 101 includes the light reflecting part 40 covering the lateral faces 20c, 20d, 20e, and 20f of the phosphor plate 20, the light guiding part 30, and the lower face 10b of the light emitting element 10, thus the areas other than the upper face 20a of the phosphor plate 20 are covered by the light reflecting part 40. This can increase the light extraction efficiency, thereby producing a high-luminance light emitting device 101. A light emitting device 101 having a so-called sharp-edged emission having clear boundaries between the emission part and non-emission part can be achieved. Moreover, direct bonding of the light emitting element 10 and the phosphor plate 20 achieves good thermal conductivity between the light emitting element 10 and the phosphor plate 20. With these characteristics, the light emitting device can suitably be used for vehicular head lamps or the like, as a light source having high luminance, high white color uniformity, and clear boundaries between the emission part and non-emission part.

The heights of the lateral faces of the light guiding part 30 are higher at both ends than the center. This likely increases the amount of light from the lateral faces of the light emitting element 10 which enters near the four corners of the phosphor plate where there otherwise tends to be a deficiency in the amount of light, thereby attenuating the luminance decline and color non-uniformity in the four corners of the phosphor plate.

The heights of the lateral faces of the light guiding part 30 can be adjusted by the layout of the light emitting elements 10 when forming the light guiding part 30. The specifications and the characteristics required of the light emitting device 101 can be satisfied by adjusting the heights of the lateral faces of the light guiding part 30.

Figure 7:
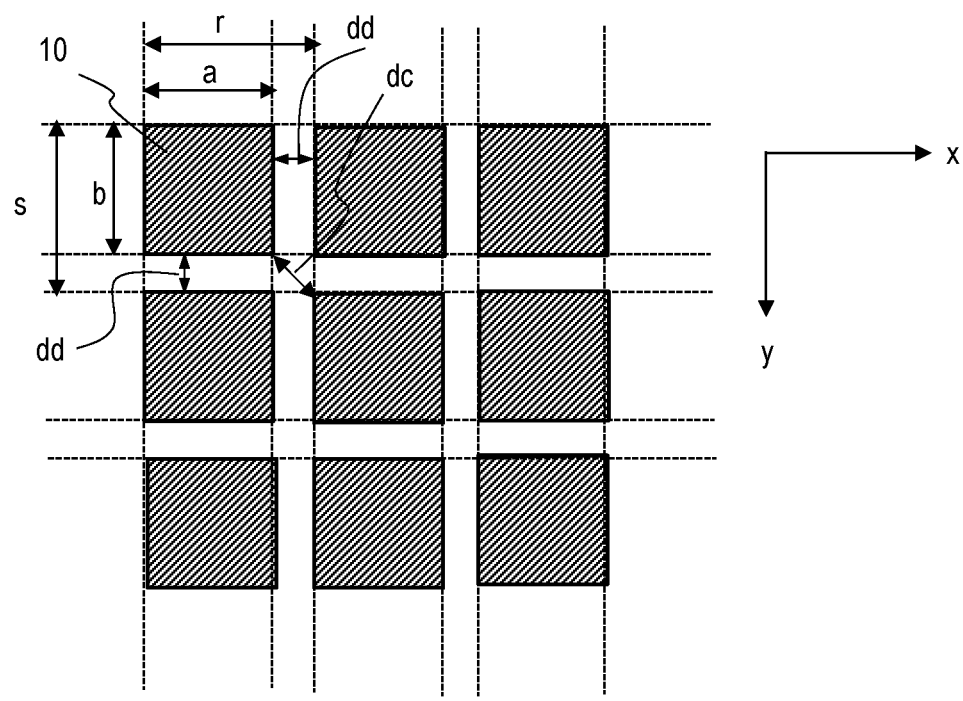
FIG. 7 is a view showing another layout of the light emitting elements in a method of manufacturing a light emitting device according to an embodiment of the present disclosure.

In this embodiment, as shown in FIG. 3B, the light guiding part 30 has lateral faces in which the height hd at both ends is greater than the height hc in the central portion. However, the light guiding part 30 may have lateral faces in which the height hd at both ends is smaller than the height hc in the central portion. That is, the relationship may be hd<hc. In the case of manufacturing a light emitting device having such a light guiding part 30, in the step of arranging a plurality of light emitting elements on the support (A), as shown in FIG. 7, the light emitting elements 10 can simply be arranged two dimensionally in the first direction (i.e., x direction) and the second direction (i.e., y direction) using pitches r and s. Here, r and s are real numbers each satisfying: a<r<2a and b<s<2b. In this way, the intervals dc can be made shorter than the intervals dd, and the light guiding part 30 having lateral faces satisfying hd<hc can be formed.

Second Embodiment

Figure 5A:
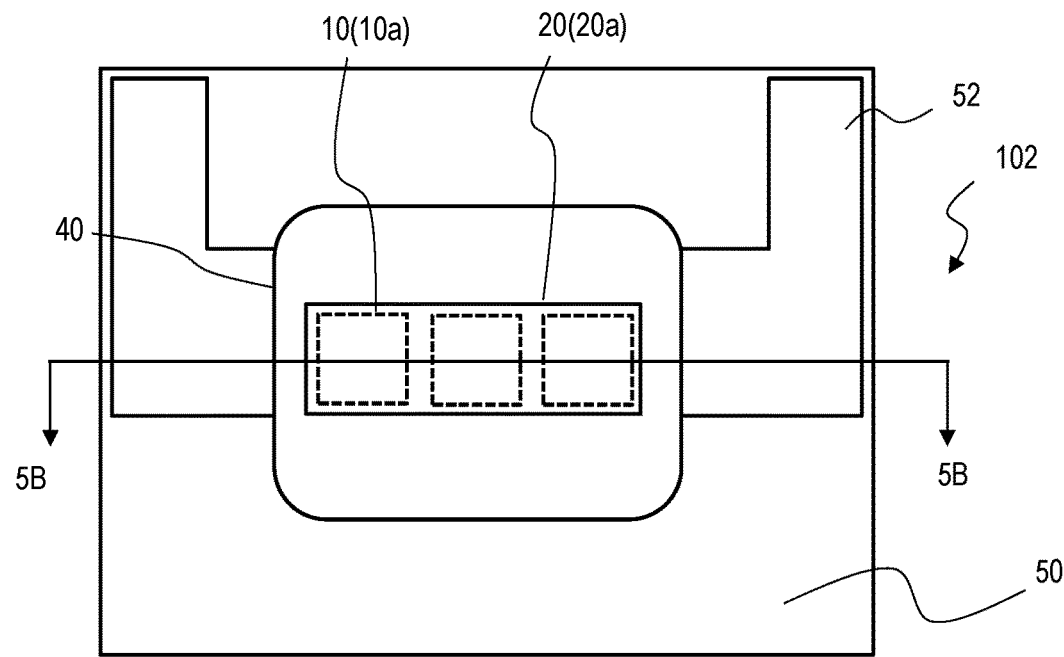
FIG. 5A is a top view of a light emitting device according to a second embodiment of the present disclosure.
Figure 5B:
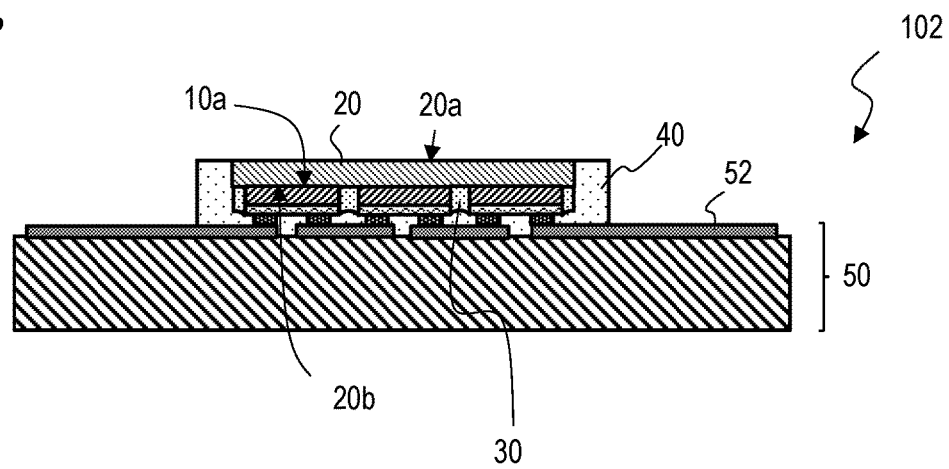
FIG. 5B is a cross-sectional view of the light emitting device taken along line 5B-5B in FIG. 5A.

FIG. 5A and FIG. 5B include a top view of a light emitting device 102 according to a second embodiment, and a cross-sectional view of the light emitting device 102 taken along line 5B-5B in FIG. 5A. The light emitting device 102 differs from the light emitting device 101 according to the first embodiment by including a plurality of light emitting elements 10. The light emitting device 102 includes three light emitting elements 10. The upper faces 10a of the light emitting elements 10 are bonded to a continuous lower face 20b of the phosphor plate 20 by direct bonding. A light guiding part 30 is disposed between the lateral faces of adjacent light emitting elements 10.

Figure 5C:
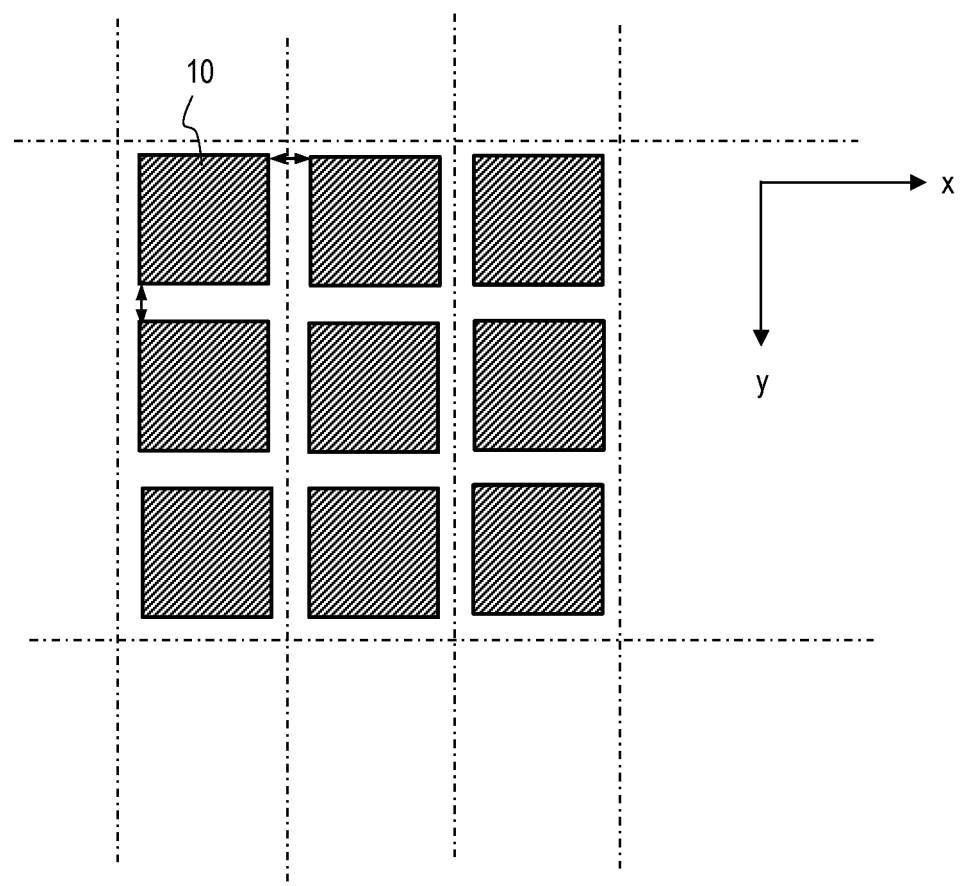
FIG. 5C is a view showing the layout of the light emitting elements in a method of manufacturing a light emitting device according to the second embodiment of the present disclosure.

The light emitting device 102 can be manufactured by two dimensionally arranging a plurality of light emitting elements 10 in the first direction (x direction) and the second direction (y direction) in the step of arranging a plurality of light emitting elements on the support (A) in the method of manufacturing the light emitting element according to the first embodiment as shown in FIG. 5C, and cutting the three light emitting elements 10, which have been two dimensionally arranged on the phosphor plate 20, as one unit indicated by the one-dot chain lines in FIG. 5C in the step of obtaining intermediates (D). In this case, the heights of the light guiding part 30 can be adjusted by changing the intervals (indicated by the arrows in FIG. 5C) of the light emitting elements 10 when arranging the light emitting elements 10 on the support 70 as explained with reference to the first embodiment. In this way, distribution of the light exiting from the lateral faces of the light emitting elements 10 and entering the phosphor plate 20 can be adjusted to thereby reduce color non-uniformity and luminance non-uniformity at the upper face 20a of the phosphor plate 20, which is the emission face.

Third Embodiment

Figure 6A:
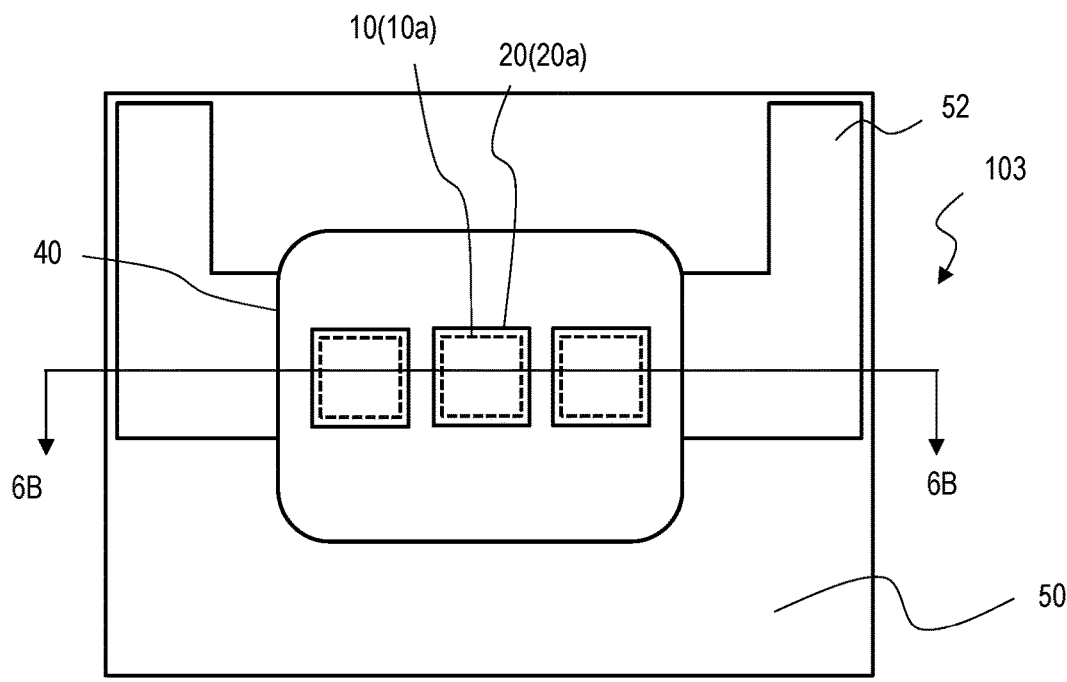
FIG. 6A is a top view of a light emitting device according to a third embodiment of the present disclosure.
Figure 6B:
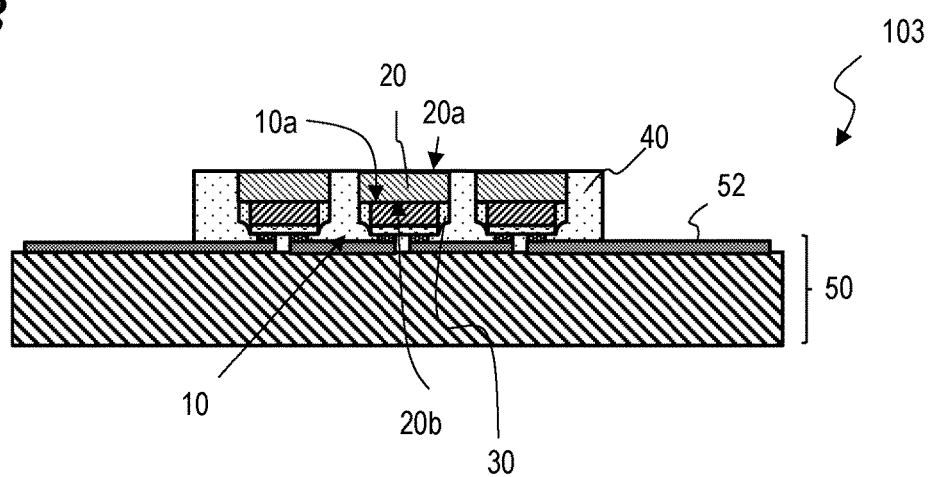
FIG. 6B is a cross-sectional view of the light emitting device taken along line 6B-6B in FIG. 6A.

FIG. 6A and FIG. 6B include a top view of a light emitting device 103 according to a third embodiment, and a cross-sectional view taken along line 6B-6B in FIG. 6A. The light emitting device 103 includes a plurality of light emitting elements 10, but differs from the light emitting device 102 according to the second embodiment by disposing a light reflecting part 40 between the light emitting elements 10. In the light emitting device 103, each of the three light emitting elements 10 are bonded to an independent phosphor plate 20, and the light reflecting part 40 is positioned between the phosphor plates 20 and between the light emitting elements 10.

The light emitting device 103 can be manufactured by arranging three intermediates 80 on the mounting board 50 and forming a light reflecting part that covers the three intermediates 80 in the step of bonding intermediates to the mounting board (E) in the method of manufacturing according to the first embodiment.

According to the light emitting device 103, the light exiting from the lateral faces of one light emitting element 10 enters its light guiding part 30, but the light reflecting part 40 can prevent the light from entering the light guiding parts 30 of adjacent light emitting elements 10.

This structure is effective in attenuating decline of the light emission efficiency by an event that light exiting from one of the light emitting elements 10 entering the light emission layer of the adjacent light emitting element.

The light emitting device according to the present invention can be used as a light source in various applications, including a light source vehicle mounted devices, lighting fixtures, various indicators, displays, liquid crystal backlights, traffic signals, automotive parts, signboard channel letters, and the like.

What is claimed is:

1. A light emitting device comprising:
  a light emitting element having an upper face, a lower face, lateral faces, and including a positive electrode and a negative electrode positioned on the lower face, the light emitting element emitting light from the upper face;
  a phosphor plate configured with an inorganic material containing a phosphor, the phosphor plate having an upper face, lateral faces, and a lower face that is larger than the upper face of the light emitting element and is in direct contact with the upper face of the light emitting element, the lower face being generally planar; and
  a light guiding part covering the lateral faces of the light emitting element and the lower face of the phosphor plate that is exposed from the light emitting element, wherein
  the lower face of the light emitting element has a rectangular shape;
  the light guiding part has a first outer side and a first inner side defined in a cross section perpendicular to the lower face that includes one of the two diagonal lines of the rectangular shape, the first outer side located at a first position farthest from the light emitting element within an area covering the lower face of the phosphor plate, wherein the first outer side has a height hd,
  the light guiding part has a second outer side and a second inner side defined in a cross section perpendicular to the lower face that includes a line passing through an intersection of the two diagonal lines of the rectangular shape and in parallel to one side of the rectangular shape, the second outer side located at a second position farthest from the light emitting element within an area covering the lower face of the phosphor plate, wherein the second outer side has a height hc, and
  the height hd is different from the height hc, and
  wherein the first inner side of the light guiding part is longer than the first outer side of the light guiding part.

2. The light emitting device according to claim 1 further comprising
  a light reflecting part that covers the lateral faces of the phosphor plate and the light guiding part.

3. The light emitting device according to claim 1, wherein the height hd and the height hc satisfy the relationship: hd>hc.

4. The light emitting device according to claim 1, wherein the height hd and the height hc satisfy the relationship: hd<hc.

5. The light emitting device according to claim 1, wherein the light emitting element is flip chip mounted on a mounting board.

6. The light emitting device according to claim 1, wherein the thickness of the phosphor plate is 50 μm to 300 μm.

7. The light emitting device according to claim 1, wherein an arithmetic average roughness of the lower face of the phosphor plate is 1 nm at most.

8. The light emitting device according to claim 1, wherein the second inner side is longer than the second outer side.

9. A light emitting device comprising:
  a light emitting element having an upper face, a lower face, lateral faces, and including a positive electrode and a negative electrode positioned on the lower face, the light emitting element emitting light from the upper face;
  a phosphor plate configured with an inorganic material containing a phosphor, the phosphor plate having an upper face, lateral faces, and a lower face that is larger than the upper face of the light emitting element and is in direct contact with the upper face of the light emitting element, the lower face being generally planar; and a light guiding part covering the lateral faces of the light emitting element and the lower face of the phosphor plate that is exposed from the light emitting element, wherein the lower face of the light emitting element has a rectangular shape;

the light guiding part has a first outer side and a first inner side defined in a cross section perpendicular to the lower face that includes one of the two diagonal lines of the rectangular shape, the first outer side located at a first position farthest from the light emitting element within an area covering the lower face of the phosphor plate, wherein the first outer side has a height hd, the light guiding part has a second outer side and a second inner side defined in a cross section perpendicular to the lower face that includes a line passing through an intersection of the two diagonal lines of the rectangular shape and in parallel to one side of the rectangular shape, the second outer side located at a second position farthest from the light emitting element within an area covering the lower face of the phosphor plate, wherein the second outer side has a height hc, and the height hd is different from the height hc, and wherein the second inner side of the light guiding part is longer than the second outer side of the light guiding part.

10. The light emitting device according to claim 9 further comprising a light reflecting part that covers the lateral faces of the phosphor plate and the light guiding part.

11. The light emitting device according to claim 9, wherein the height hd and the height hc satisfy the relationship: hd>hc.

12. The light emitting device according to claim 9, wherein the height hd and the height hc satisfy the relationship: hd<hc.

13. The light emitting device according to claim 9, wherein the light emitting element is flip chip mounted on a mounting board.

14. The light emitting device according to claim 9, wherein the thickness of the phosphor plate is 50 μm to 300 μm.

15. The light emitting device according to claim 9, wherein an arithmetic average roughness of the lower face of the phosphor plate is 1 nm at most.

* * * * *